(12) United States Patent
Park

(10) Patent No.: US 7,681,097 B2
(45) Date of Patent: Mar. 16, 2010

(54) TEST SYSTEM EMPLOYING TEST CONTROLLER COMPRESSING DATA, DATA COMPRESSING CIRCUIT AND TEST METHOD

(75) Inventor: Hwan-wook Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 329 days.

(21) Appl. No.: 11/778,161

(22) Filed: Jul. 16, 2007

(65) Prior Publication Data

US 2008/0109690 A1    May 8, 2008

(30) Foreign Application Priority Data

Nov. 7, 2006  (KR) ...................... 10-2006-0109527

(51) Int. Cl.
G01R 31/28   (2006.01)
G11C 19/00   (2006.01)

(52) U.S. Cl. .......................... 714/732; 714/736; 377/69; 377/72

(58) Field of Classification Search ........................ None
See application file for complete search history.

(56) References Cited

U.S. PATENT DOCUMENTS

| 7,185,251 B2 * | 2/2007 | Moyer et al. ................. 714/729 |
| 7,353,440 B2 * | 4/2008 | Ohwada et al. ............. 714/726 |
| 7,404,126 B2 * | 7/2008 | Jain et al. .................... 714/726 |

FOREIGN PATENT DOCUMENTS

| KR | 100261019 B1 | 4/2000 |
| KR | 1020010045334 A | 6/2001 |
| KR | 1020030049481 A | 6/2003 |
| KR | 1020060048345 A | 5/2006 |

* cited by examiner

*Primary Examiner*—Christine T Tu
(74) *Attorney, Agent, or Firm*—Volentine & Whitt, PLLC

(57) ABSTRACT

A test system employing a test controller compressing data, a data compressing circuit and a test method are provided. The test system includes a tester, a device under test (DUT), and a test controller receiving a first clock signal and serial data bits output from the DUT, compressing the serial data bits by m bits (m≧4) in response to a second clock signal to generate a signature signal, and outputting the signature signal to the tester. The tester compares a computed signature signal to a 1-bit signature signal to determine whether the DUT is operating poorly or not.

9 Claims, 3 Drawing Sheets

US 7,681,097 B2

TEST SYSTEM EMPLOYING TEST CONTROLLER COMPRESSING DATA, DATA COMPRESSING CIRCUIT AND TEST METHOD

CROSS-REFERENCE TO RELATED PATENT APPLICATION

This application claims the benefit of Korean Patent Application No. 10-2006-0109527, filed on Nov. 7, 2006, the subject matter of which is hereby incorporated by reference.

BACKGROUND OF THE INVENTION

1. Field of the Invention

The present invention relates to a semiconductor device test method. More particularly, the invention relates to a test system employing a test controller compressing data, a data compressing circuit, and a test method.

2. Description of the Related Art

The overall increase in the operating speed of contemporary semiconductor devices mandate the use during testing of high speed test equipment (hereafter generically referred to as a "tester"). However, high speed testers are expensive, and so equivalent low speed methods testing have been developed. One such method converts high-speed serial data into parallel data for testing of semiconductor devices. In order to implement this type of test method, a tester must allocate to various data channels a required number of parallel data bits. Accordingly, the number of tester channels is limited and the corresponding number of semiconductor devices that can be simultaneously tested is considerably reduced.

Alternately or additionally, data compressing apparatuses are used to compress a parallel stream of data bits. A multiple input signature register (MISR) is widely used as the data compressing apparatus. The MISR compresses parallel data bits to generate a signature signal. The MISR generally includes a feedback tap. When a specific bit of the parallel data bits has an error, the signature signal is masked.

When a specific bit and the following bit have errors, that is, when two consecutive bits have errors, the MISR may generate a signature signal identical to the signature signal generated by compressing normal parallel data bits. This is referred to as "an aliasing effect." In this case, the MISR has a problem in that the output signature signal indicates that two bits of parallel data bits do not have an error when in fact they do.

Accordingly, if defective bits of parallel data bits are immediately monitored in a data compressing process using MISR, the aliasing effect can be prevented. Furthermore, if high-speed serial data bits output from a semiconductor device are converted into parallel data bits, the parallel data bits are compressed into a 1-bit signature signal, and the semiconductor device is tested using the 1-bit signature signal, the semiconductor device can be tested using a tester operating at a low speed without increasing the number of tester channels.

SUMMARY OF THE INVENTION

Embodiments of the present invention provide a test system employing a test controller compressing data in order to test a high-speed semiconductor device with a low-speed tester. Embodiments of the invention also provide a data compressing circuit for compressing a plurality of serial data units into a signature signal. Embodiments of the invention also provide a test method using the data compressing circuit.

In one embodiment, the invention provides a test system comprising; a low speed tester connected to a high speed device under test (DUT) through a test controller, the test controller receiving a first clock signal and serial data bits output from the DUT, compressing the serial data bits by m bits ($m \geq 4$) in response to a second clock signal to generate a signature signal, and outputting the signature signal to the tester.

In another embodiment, the invention provides a data compressing circuit for compressing m-bit ($m \geq 4$) serial data into a 1-bit signature signal, comprising; m first flip-flops connected in series and sequentially receiving the bits of the m-bit serial data in response to a first clock signal, m second flip-flops storing m-bit initial seed data and respectively receiving outputs of m comparators in response to a second clock signal, and the m comparators respectively comparing the outputs of the first flip-flops to 1-bit circular-shifted outputs of the second flip-flops, wherein the output of the last flip-flop of the second flip-flops is output as the signature signal.

In another embodiment, the invention provides a data compressing circuit for compressing m-bit ($m \geq 8$) serial data into m/4-bit signature signals, comprising; m first flip-flops connected in series and sequentially receiving the bits of the m-bit serial data in response to a first clock signal, m second flip-flops storing m-bit initial seed data and respectively receiving outputs of m comparators in response to a second clock signal, the m comparators respectively comparing the outputs of the first flip-flops to 1-bit circular-shifted outputs of the second flip-flops, and a switch connected to the output port of the (m/2)th flip-flop of the second flip-flops and outputting a first signature signal in response to a third clock signal, wherein the output of the last flip-flop of the second flip-flops is output as a second signature signal.

In another embodiment, the invention provides a test method comprising; outputting a first clock signal and m-bit ($m \geq 4$) serial data from a DUT, sequentially inputting the bits of the serial data to m first flip-flops connected in series in response to the first clock signal, storing initial seed data in m second flip-flops, 1-bit circular-shifting the outputs of the second flip-flops in response to a second clock signal, respectively performing exclusive OR operations on the outputs of the first flip-flops and the 1-bit circular-shifted outputs of the second flip-flops, storing the results of the exclusive OR operations in the second flip-flops in response to the second clock signal and outputting the output of the last flip-flop of the second flip-flops as a signature signal, and comparing a computed signature signal stored in a tester to the signature signal to determine whether the DUT is operating poorly or not.

In another embodiment, the invention provides a test method comprising; outputting a first clock signal and m-bit ($m \geq 8$) serial data from a device under test (DUT), sequentially inputting the bits of the serial data to m first flip-flops connected in series in response to the first clock signal, storing initial seed data in m second flip-flops, 1-bit circular-shifting the outputs of the second flip-flops in response to a second clock signal, respectively performing exclusive OR operations on the outputs of the first flip-flops and the 1-bit circular-shifted outputs of the second flip-flops, storing the results of the exclusive OR operations in the second flip-flops in response to the second clock signal, outputting the output of the (m/2)th flip-flop of the second flip-flops as a first signature signal in response to a third clock signal and outputting the output of the last flip-flop of the second flip-flops as a second signature signal; and comparing computed signature signals stored in a tester to the first and second signature signals to determine whether the DUT is operating poorly or not.

BRIEF DESCRIPTION OF THE DRAWINGS

Embodiments of the invention will be described with reference to the attached drawings in which.

FIGURE (FIG.) 1 is a block diagram of a test system according to an embodiment of the invention.

DESCRIPTION OF EMBODIMENTS

Figure 1:
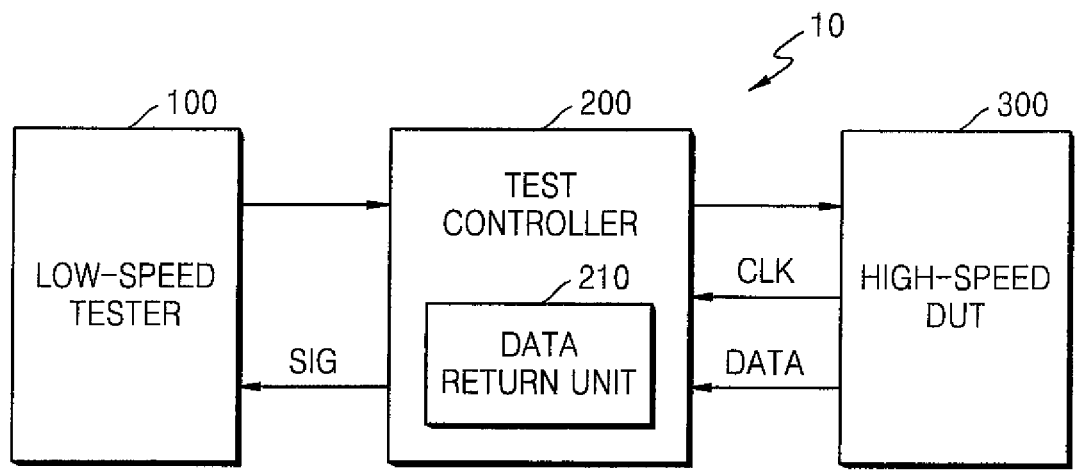

The present invention will now be described more fully in relation to exemplary embodiments. The invention may, however, be embodied in many different forms and should not be construed as being limited to only the illustrated embodiments. Rather, these embodiments are presented as teaching examples. Throughout the written description and drawings, like reference numerals refer to like or similar elements.

FIG. 1 is a block diagram of a test system 10 according to an embodiment of the invention. Referring to FIG. 1, a test controller 200 is connected between a high speed semiconductor device 300 (hereafter referred to as "Device Under Test" or DUT) and a low speed tester 100. Test controller 200 functions as an interface between DUT 300 and tester 100. Test controller 200 receives a first clock signal CLK and data DATA from DUT 300, and generally includes a data return unit 210 generating a signature signal SIG and outputting the signature signal SIG to tester 100. The signature signal SIG is generated by processing the bits of the data DATA serially received from DUT 300 into parallel data bits and compressing the parallel data bits.

Figure 2:
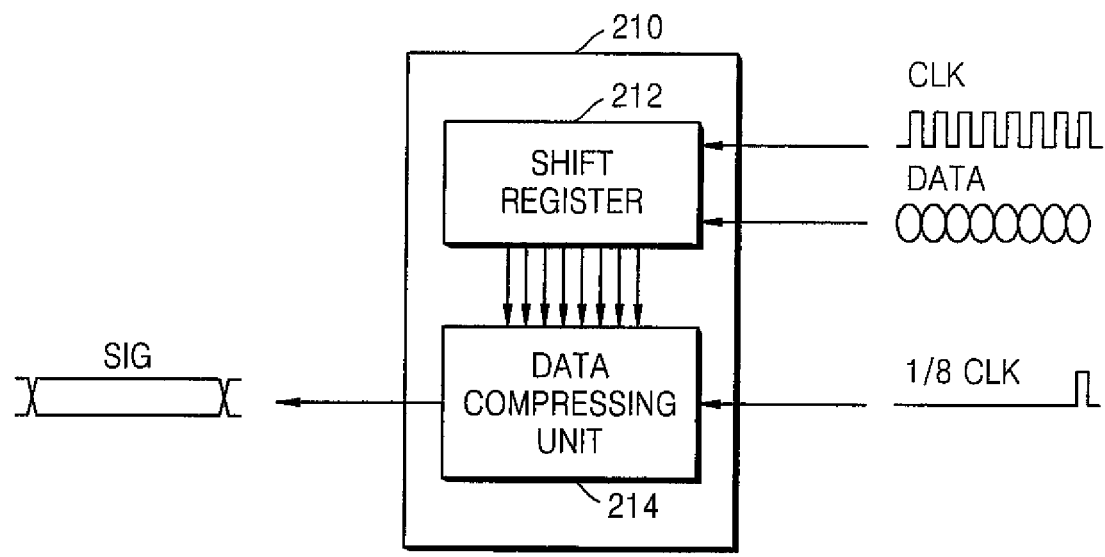
FIG. 2 further illustrates the test controller shown in FIG. 1.

FIG. 2 further illustrates an exemplary data return unit 210. Referring to FIG. 2, data return unit 210 includes a shift register 212 receiving the data DATA in accordance with the first clock signal CLK, and a data compressing unit 214 compressing an output signal received from shift register 212 to generate the signature signal SIG in accordance with a second clock signal (e.g., a divided down version of the first clock signal, indicated in the illustrated embodiment as "⅛ CLK").

In the illustrated embodiment, the data DATA is shown with eight bits, but this is just one possible example. The eight data bits DATA are sequentially input to shift register 212 in response to the first clock signal CLK. The second clock signal ⅛ CLK is generated at the pulse of the first clock signal CLK at which the last of the eight data bit is input to shift register 212. Thus, the second clock signal ⅛ CLK has a cycle corresponding to the period of time it takes to sequentially shift into (or store) the eight data bits are shift register 212. Examples of shift register 212 and data compressing unit 214 are further illustrated in FIG. 3.

Figure 3:
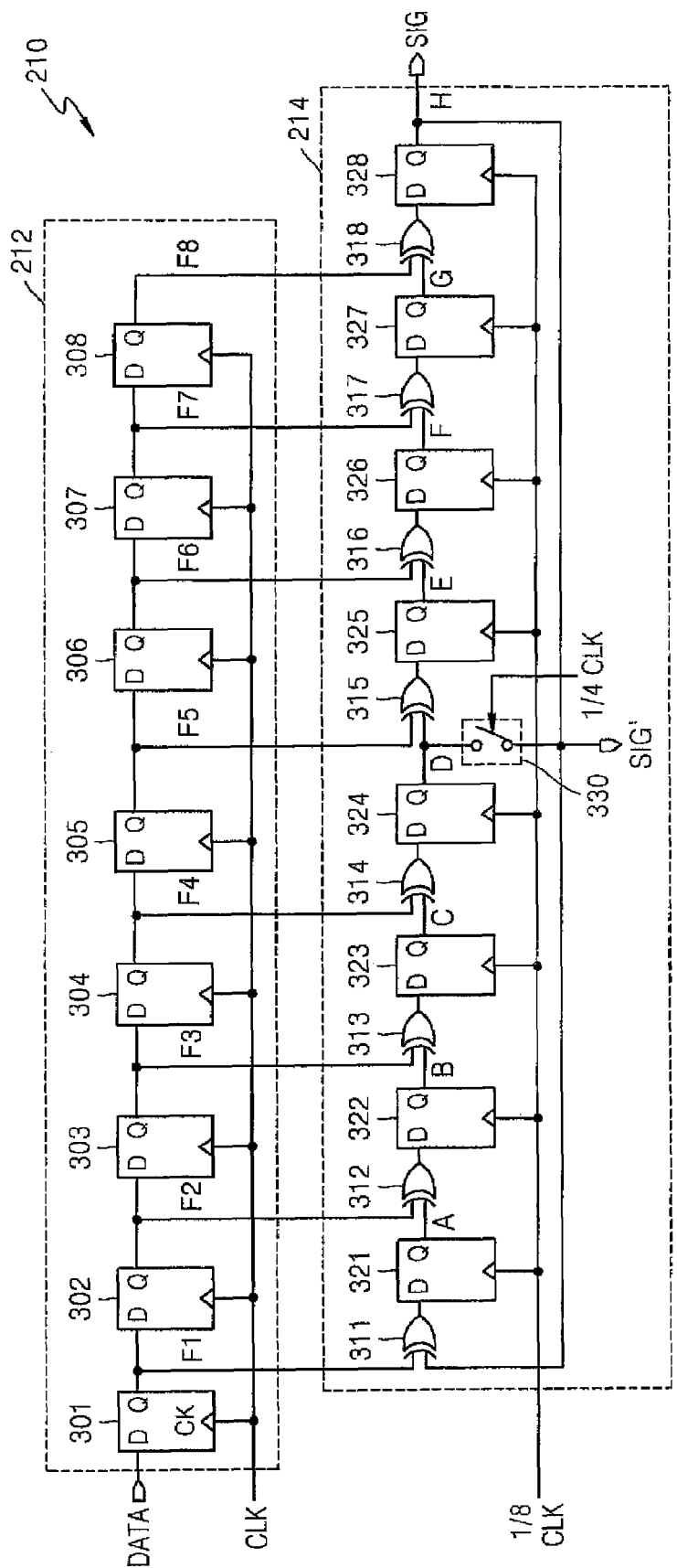
FIG. 3 further illustrates the data return unit shown in FIG. 2.

Referring to FIG. 3, shift register 212 includes eight flip-flops 301 through 308 connected in series. Flip-flop 301 has a data port D to which the eight data bits DATA are sequentially input, a clock port CK to which the clock signal CLK is applied, and an output port g connected to a data port D of flip-flop 302. Flip-flop 301 sequentially receives the eight data bits DATA in response to the clock signal CLK. Flip-flops 302 though 308 respectively receive the output signals of preceding flip-flops 301 through 307 in response to the first clock signal CLK. Flip-flops 301 through 308 respectively shift the sequentially input eight data bits DATA in response to the first clock signal CLK and output signals F1 through F8.

Data compressing unit 214 includes eight comparators 311 through 318 and eight flip-flops 321 through 328. Comparator 311 compares the output signal F1 of flip-flop 301 of shift register 212 to the output signal H of flip-flop 328 and inputs the comparison result to flip-flop 321. Flip-flop 321 receives the output signal of comparator 311 in response to the second clock signal ⅛ CLK. The comparators 312 through 318 respectively compare the output signals F2 through F8 of flip-flops 302 through 308 of shift register 212 to the output signals A through G of flip-flops 321 through 327. Flip-flops 322 through 328 respectively receive the output signals of comparators 312 through 318 in response to the second clock signal ⅛ CLK. The output signal H of flip-flop 328 becomes the signature signal SIG.

Data compressing unit 214 further includes a switch 330 connected to the output port g of flip-flop 324. Switch 330 outputs the output signal D of flip-flop 324 as a first signature signal SIG' in response to a third clock signal (e.g., another divided down version of the first clock signal CLK, indicated in the illustrated embodiment as "¼ CLK"). The third clock signal ¼ CLK is generated at the pulse of the first clock signal CLK at which the fourth of the eight data bits is input. In this case, the output signal H of flip-flop 328, which is output in response to the second clock signal ⅛ CLK, becomes a second signature signal SIG. The first and second signature signals SIG and SIG' with respect to 4-bit data or the signature signal SIG with respect to the 8-bit data DATA is provided to the tester 100 according to whether switch 330 is ON or OFF. Accordingly, data can be compressed by 4 bits or 8 bits according to a user selected option. Under similar assumptions, when 16-bit data is input, it can be compressed by 4 bits, 8 bits or 16 bits. For convenience of explanation, the input data is hereafter assumed to be compressed by 8 bits.

Figure 4:
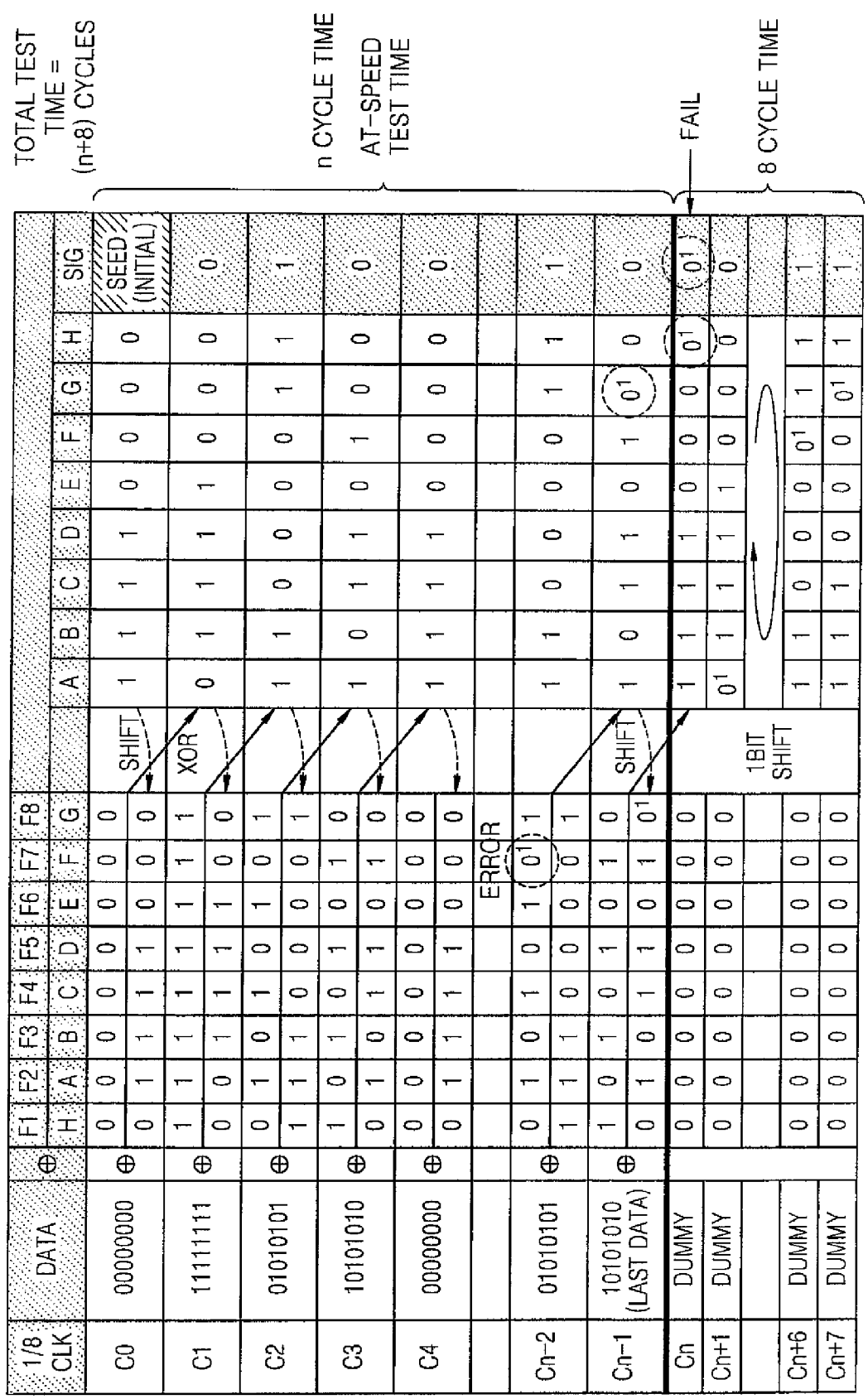
FIG. 4 is a data diagram illustrating the operation of the data return unit shown in FIG. 3.

The operation of data return unit 210 illustrated in FIG. 3 will be further explained with reference to FIG. 4. It is assumed that the output signals A through H of flip-flops 321 through 328 of data compressing unit 214 are 11110000 as initial seed data.

During a first cycle C0 of the second clock signal ⅛ CLK, data bits, for example, 00000000, are input to flip-flops 301 through 308 of shift register 212 in response to the first clock signal CLK and flip-flops 301 through 308 output 00000000 as output signals F1 through F8. Comparators 311 through 318 of data compressing unit 214 respectively compare the output signals F1 through F8 of flip-flops 301 through 308, that is, 00000000, to the output signals H and A through G of flip-flop 328 and flip-flops 321 through 327, 01111000, which are 1-bit circular-shifted in response to the second clock signal ⅛ CLK, and output 01111000. The output signals of comparators 311 through 318, 01111000, are output as the output signals A through H of flip-flops 321 through 328 in the second cycle C1 of the second clock signal ⅛ CLK. Here, the output signal H of flip-flop 328, 0, is output as the signature signal SIG.

During a second cycle C1 of the second clock signal ⅛ CLK, data bits, for example, 11111111, are input to flip-flops 301 through 308 of shift register 212 in response to the first clock signal CLK and flip-flops 301 through 308 output 11111111 as their output signals F1 through F8. Comparators 311 through 318 of data compressing unit 214 respectively compare the output signals F1 through F8 of flip-flops 301 through 308, 11111111, to the output signals H and A through G of flip-flop 328 and flip-flops 321 through 327, 00111100, which are 1-bit circular-shifted in response to the second clock signal ⅛ CLK, and output 11000011. The output signals of comparators 311 through 318, 11000011, are output as the output signals A through H of flip-flops 321 through 328 during a third cycle C2 of the second clock signal ⅛ CLK. Here, the output signal H of flip-flop 328, 1, is output as the signature signal SIG.

During the third cycle C2 of the second clock signal ⅛ CLK, data bits, for example, 01010101, are input to flip-flops 301 through 308 of shift register 212 and comparators 311 through 318 of data compressing unit 214 respectively output 10110100. During a fourth cycle C3 of the second clock signal ⅛ CLK, flip-flops 321 through 328 of data compressing circuit 214 output 10110100 as their output signals A through H, and 0 is output as the signature signal SIG.

During the fourth cycle C3 of the second clock signal ⅛ CLK, data bits, for example, 10101010, are input to flip-flops 301 through 308 of shift register 212 and comparator 311 through 318 of data compressing unit 214 respectively output 11110000. During a fifth cycle C4 of the second clock signal ⅛ CLK, flip-flops 321 through 328 of data compressing unit 214 output 11110000 as their output signals A through H, and 0 is output as the signature signal SIG.

During the (n−1)th cycle Cn−2 of the second clock signal ⅛ CLK, data bits, for example, 01010101, are input to flip-flops 301 through 308 of shift register 212. Here, flip-flops 301 through 308 output 01010111 as their output signals F1 through F8 if an error is generated in the output signal F7 of flip-flop 307. Comparators 311 through 318 of data compressing unit 214 respectively compare the output signals F1 through F8 of flip-flops 301 through 308, 01010111, to the output signals H and A through G of flip-flop 328 and flip-flops 321 through 327, 11100001, which are 1-bit circular-shifted in response to the second clock signal ⅛ CLK, and output 10110110. The output signals of comparators 311 through 318, 10110110, are output as the output signals A through H of flip-flops 321 through 328 during the nth cycle Cn−1 of the second clock signal ⅛ CLK. Here, 0 is output as the signature signal SIG.

During the nth cycle Cn−1 of the second clock signal ⅛ CLK, data bits, for example, 10101010, are input to flip-flops 301 through 308 of shift register 212 and flip-flops 301 through 308 output 10101010 as their output signals F1 through F8. Comparators 311 through 318 of data compressing unit 214 respectively compare the output signals F1 through F8 of flip-flops 301 through 308, 10101010, to the output signals H and A through G of flip-flop 328 and flip-flops 321 through 327, 01011011, which are 1-bit circular-shifted in response to the second clock signal ⅛ CLK, and output 11110001. The output signals of comparators 311 through 318, 11110001, are output as the output signals A through H of flip-flops 321 through 328 during the (n+1)th cycle Cn of the second clock signal ⅛ CLK. Here, 1 is output as the signature signal SIG.

In the n cycles of the second clock signal ⅛ CLK, n 8-bit data units are input to data return unit 210 and flip-flops 321 through 328 output 11110001 as their output signals A through H. If the error is not generated in the (n−1)th cycle of the second clock signal ⅛ CLK, flip-flops 321 through 328 will output 11110000 as their output signals A through H.

In the period from the (n+1)th cycle Cn to the (n+8)th cycle Cn+7 of the second clock signal ⅛ CLK, only the signature signal SIG is output without having data input to shift register 212. Accordingly, the signature signal SIG is respectively output as 1,0,0,0,1,1,1 and 1 in the (n+1)th cycle Cn through the (n+8)th cycle Cn+7 of the second clock signal ⅛ CLK.

The signature signal SIG output from data return unit 210 is provided to low speed tester 100. Low-speed tester 100 has expectation data. When the DUT 300 is not operating poorly, the expectation data will be identical to the data DATA output from DUT 300. Low-speed tester 100 has signature signals computed from the expectation data and the initial seed data using a competent computational program. This computational program replicates the functionality of shift register 210 and data compressing unit 214 of data return unit 210 in software. Low-speed tester 100 compares the signature signals to the signature signal output from data return unit 210 of memory controller 200 and determines whether DUT 300 is operating poorly or not.

Referring back to FIG. 4, in the n cycles of the second clock signal ⅛ CLK, n 8-bit data units are input to data return unit 210 and flip-flops 321 through 328 output 11110001 as their output signals A through H. The signature signal SIG is respectively output as 1,0,0,0,1,1,1 and 1 in the (n+1)th cycle through the (n+8)th cycle of the second clock signal ⅛ CLK and compared to the signature signals computed by low-speed tester 100 to determine whether DUT 300 is operating poorly or not. The time required to test n data units corresponds to the sum of the n cycles of the second clock signal ⅛ CLK required to input the n data units, and eight cycles of the second clock signal ⅛ CLK, required to output the 8-bit data corresponding to the outputs of flip-flops 321 through 328. That is, (n+8) cycles of the second clock signal ⅛ CLK are needed. When n equals $2^8$=256, 256 data units are input in 256 cycles of the second clock signal ⅛ CLK and 264(=256+8) cycles of the second clock signal ⅛ CLK are required to test the 256 data units. That is, the input of the data and the test of the data are almost simultaneously carried out.

Test controller 200 generates the signature signal SIG with respect to data units input up to now in the cycle following the cycle of the second clock signal ⅛ CLK in which the current data is input. Accordingly, low-speed tester 100 compares the signature signals calculated from the data units input up to now and the initial seed data to the signature signal SIG output from tester controller 200. That is, it is possible to monitor the signature signal SIG according to the data DATA input up to now to immediately detect a data bit having an error.

Furthermore, tester controller 200 compresses 8-bit input data by 4 bits or 8 bits to generate signature signals. That is, input data can be compressed by various numbers of bits, such as 4 bits, 8 bits or 16 bits.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A test system comprising:
 a tester connected to a device under test (DUT) through a test controller,
 the test controller receiving a first clock signal and m-bit serial data output from the DUT, compressing the m-bit serial data in response to a second clock signal to generate a signature signal, and outputting the signature signal to the tester,
 wherein the test controller comprises:
  a shift register including m first flip-flops connected in series, sequentially receiving bits of the m-bit serial data in response to a first clock signal, and respectively providing outputs from the m first flip-flops to m comparators; and a data compressing circuit compressing the m-bit serial data into the signature signal and comprising:

m second flip-flops initially storing m-bit initial seed data and respectively receiving outputs from the m comparators in response to the second clock signal generated at a pulse of the first clock signal at which an $m^{th}$ serial bit of the m-bit serial data is input, wherein an output of a last flip-flop of the second flip-flops feedback connected to a first comparator of the m comparators is output as the signature signal, the m comparators respectively compare $(n+1)^{th}$ outputs of the first flip-flops to $n^{th}$ outputs of the second flip-flops, m is greater than or equal to 4, and n is an integer ranging from 1 to (m−1).

2. The test system of claim 1, wherein the signature signal has one bit.

3. The test system of claim 1, wherein each of the m comparators is an exclusive OR gate.

4. The test system of claim 1, wherein the tester computes and stores data expected from the DUT, stores a computed signature signal computed from the initial seed data, and compares the computed signature signal to the signature signal generated by the test controller to determine whether or not the DUT is operating poorly.

5. The test system of claim 1, wherein the DUT is a semiconductor memory device.

6. A test system comprising:

a tester connected to a device under test (DUT) through a test controller, the test controller receiving a first clock signal and m-bit serial data from the DUT, compressing the m-bit serial data in response to a second clock signal to generate a signature signal, and providing the signature signal to the tester, wherein the test controller comprising:

a shift register including m first flip-flops connected in series, sequentially receiving bits of the m-bit serial data in response to a first clock signal, and respectively providing outputs of the m first flip-flops to m comparators; and a data compressing circuit compressing the m-bit serial data into at least two signature signals, wherein the data compressing circuit comprises:

m second flip-flops initially storing m-bit initial seed data and respectively receiving outputs from the m comparators in response to a second clock signal, wherein an output of a last flip-flop of the second flip-flops feedback connected to a first comparator of the m comparators is output as a second signature signal;

a switch connected to the output of an $(m/2)^{th}$ flip-flop of the second flip-flops and outputting a first signature signal in response to a third clock signal, wherein the m comparators respectively compare $(n+1)^{th}$ outputs of the first flip-flops to $n^{th}$ outputs of the second flip-flops, m is an even integer greater than or equal to 8 and n is an integer ranging from 1 to (m−1).

7. The data compressing circuit of claim 6, wherein the second clock signal is generated at a pulse of the first clock signal at which the $m^{th}$ bit of the m-bit serial data is input.

8. The data compressing circuit of claim 6, wherein the third clock signal is generated at a pulse of the first clock signal at which the $(m/2)^{th}$ bit of the m-bit serial data is input.

9. The data compressing circuit of claim 6, wherein each of the m comparators is an exclusive OR gate.

* * * * *